United States Patent
Takahashi

(10) Patent No.: US 8,279,917 B2
(45) Date of Patent: Oct. 2, 2012

(54) PULSE WIDTH MODULATION CONTROLLER AND PULSE WAVEFORM CONTROL METHOD

(75) Inventor: Hideyuki Takahashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 810 days.

(21) Appl. No.: 12/453,606

(22) Filed: May 15, 2009

(65) Prior Publication Data

US 2009/0296805 A1 Dec. 3, 2009

(30) Foreign Application Priority Data

May 28, 2008 (JP) .................................. 2008-139878

(51) Int. Cl.
*H03K 7/08* (2006.01)
(52) U.S. Cl. ........................................ 375/238; 332/109
(58) Field of Classification Search .................. 375/238; 327/31, 172; 332/109
See application file for complete search history.

(56) References Cited

U.S. PATENT DOCUMENTS

| | | | |
|---|---|---|---|
| 2005/0184778 A1* | 8/2005 | Figoli | 327/172 |
| 2008/0079407 A1* | 4/2008 | Shimada et al. | 323/283 |
| 2009/0225020 A1* | 9/2009 | Ran et al. | 345/102 |

FOREIGN PATENT DOCUMENTS

JP 3967370 6/2007

* cited by examiner

*Primary Examiner* — David B. Lugo
(74) *Attorney, Agent, or Firm* — McGinn IP Law Group, PLLC

(57) ABSTRACT

A pulse width modulation (PWM) controller includes: a first counter for counting a reference clock signal, and thus outputting a first count value, a leading edge control signal generator for outputting a leading edge control signal on a basis of the first count value, an adjustment clock generator for generating an adjustment clock signal, a second counter controller for instructing the adjustment clock generator to start to output the adjustment clock signal, a second counter for outputting a second count value, a trailing edge control signal generator for outputting a trailing edge control signal on a basis of the second count value, and a PWM pulse generator for synthesizing the leading edge control signal and the trailing edge control signal, and thus generating a pulse width modulation signal.

10 Claims, 7 Drawing Sheets

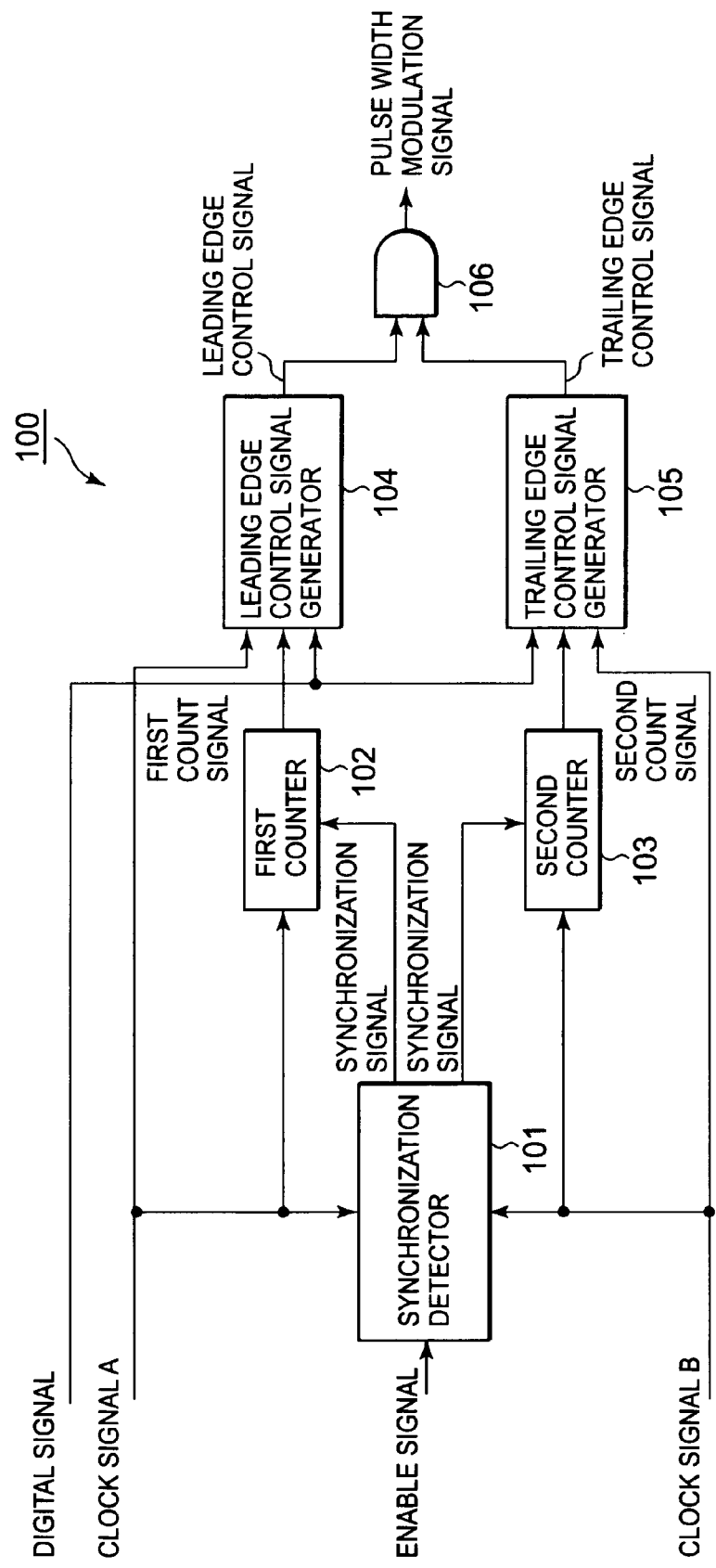

PULSE WIDTH MODULATION CONTROLLER AND PULSE WAVEFORM CONTROL METHOD

INCORPORATION BY REFERENCE

This application is based upon and claims the benefit of priority from Japanese Patent Application No. 2008-139878 which was filed on May 28, 2008, the disclosure of which is incorporated herein in its entirety by reference.

BACKGROUND OF THE INVENTION

1. Field of the Invention

A PWM (Pulse Width Modulation) controller and a pulse waveform control method of the present invention relate particularly to a PWM controller for controlling a pulse width of a PWM signal and a pulse waveform control method for the same.

2. Description of Related Art

In these years, a strict limitation on power consumption is required for a-semiconductor device installed in a portable apparatus such as a mobile phone, in order to extend usable time of the apparatus. Such a semiconductor device receives power supply through a power supply control circuit to obtain a stable power supply, in some cases. Here, to achieve reduction in power consumption of the semiconductor device, the power supply control circuit needs to be precisely controlled so as to suppress its rapid activation and outputted voltage fluctuation. The power supply control circuit controls the power supply to the semiconductor device by sending PWM (Pulse Width Modulation) pulses to a PID (Power Intelligence Device) that is a switching element. When such a power supply control circuit precisely suppresses the outputted voltage fluctuation, the power supply control circuit needs to control the PWM pulses with a high-resolution step. However, to increase the resolution of the PWM pulses, a clock frequency to be used must be increased, thereby causing a problem of increasing the power consumption of the semiconductor device.

In this respect, Patent Document 1 has disclosed an example of the PWM controller for modulating PWM pulses. FIG. 7 shows a block diagram of the PWM controller 100 disclosed in Patent Document 1. The PWM controller 100 is a digital pulse width modulator which generates a pulse width modulation signal by modulating clock signals depending on a digital signal value. The PWM controller 100 includes a synchronization detector 101, a first counter 102, a second counter 103, a leading edge control signal generator 104, a trailing edge control signal generator 105 and a pulse width modulation signal generator 106. In addition, as the clock signals, two clock signals (a clock signal A and a clock signal B) having a frequency ratio of (N+1):N are supplied to the PWM controller 100.

The synchronization detector 101 detects timing when the clock signal A and the clock signal B synchronize with each other, and thus outputs a synchronization signal to the first counter 102 and the second counter 103. An enable signal is inputted into the synchronization detector 101. While the enable signal is asserted (effective), the synchronization detector 101 operates. The first counter 102 is initialized depending on the synchronization signal, then counts the clock signal A, and thus generates a first count signal. The second counter 103 is initialized depending on the synchronization signal, then counts the clock signal B, and thus generates a second count signal. By use of the clock signal A, the leading edge control signal generator 104 generates a leading edge control signal for identifying the pulse leading edge position of the pulse width modulation signal in accordance with the first count signal and a digital signal. By use of the clock signal B, the trailing edge control signal generator 10 generates a trailing edge control signal for identifying the trailing edge position of the pulse width modulation signal in accordance with the second count signal and the digital signal. The pulse width modulation signal generator 106 synthesizes the leading edge control signal generated by the leading edge control signal generator 104 and the trailing edge control signal generated by the trailing edge control signal generator 105, and thus generates the pulse width modulation signal.

In this respect, the clock signal A has a frequency which is $\{(N+1) \times M\}$ times as high as the frequency of a sampling clock of the digital signal. In addition, the clock signal B has a frequency which is $\{N \times M\}$ times as high as the frequency of the sampling clock of the digital signal. Note that N is the power of 2, or the power of 10. Furthermore, the digital signal represents a 16-bit digital data, for example.

In the PWM controller 100, first of all, the synchronization detector 101 detects that the rising edge position of the clock signal A and the rising edge position of the clock signal B switch positions back and forth. Subsequently, depending on this switch of positions between the edges, the synchronization detector 101 outputs the synchronization signal to the first counter 102 and the second counter 103, and thus initializes the first counter 102 and the second counter 103.

Thereafter, the first counter 102 is initialized on the basis of the synchronization signal, and starts to count the clock signal A after the initialization is completed, thereby outputting the counted number of the clock signal A as the first count value. The first count signal has a value which recurs between 0 (zero) and $\{(N+1) \times M-1\}$. On the other hand, the second counter 103 is initialized on the basis of the synchronization signal, and starts to count the clock signal B after the initialization is completed, thereby outputting the counted number of the clock signal B as the second count signal. The second count signal has a value which recurs between 0 (zero) and $\{N \times M-1\}$.

In this respect, the frequency ratio between the clock signal A and the clock signal B is (N+1):N. Consequently, the phase difference between the clock signal A and the clock signal B recurs with (N+1) cycles. N-step phase difference sequentially appears in units of (one cycle of the clock signal A)/N. For example, at a starting point, the phase difference between the clock signal A and the clock signal B is 0/N cycle; around the middle, the phase difference between the clock signal A and the clock signal B is (N/2)/N cycle; and at an end point, the phase difference between the clock signal A and the clock signal B is (N−1)/N cycle. Note that the first counter 102 and the second counter 103 are synchronized with each other. For this reason, if a value of the second counter 103 is identified, then it is possible to identify the phase difference between the rising edge of the clock signal B which corresponds to the value and the rising edge of the clock signal A which immediately precedes the thus-identified rising edge of the clock signal B.

Afterward, the leading edge control signal generator 104 identifies a pulse leading edge position on the basis of the digital signal. Thus, the leading edge control signal generator 104 asserts the leading edge control signal depending on the rising edge of the clock signal A which causes the position to correspond to the value of the first count signal. Subsequently, the leading edge control signal generator 104 negates the leading edge control signal at the end point of the first count signal. The trailing edge control signal generator 105 identifies a pulse trailing edge position on the basis of the digital signal. Thus, the trailing edge control signal generator 105 negates the trailing edge control signal depending on the rising edge of the clock signal B which causes the position to correspond to the value of the second count signal. Subsequently, the trailing edge control signal generator 105 asserts the trailing edge control signal at the starting point of the second count signal.

In this point, descriptions will be provided for how the PWM controller operates in a case where: N is set at 128, while M is set at 5; N and M are applied to the 16-bit digital signal. First of all, in order to calculate the pulse trailing edge position of the pulse width modulation signal, a value (in this case, {N×(M−1)−1}=128×4−1) of the second count signal at a certain synchronization time between the clock signal A and the clock signal B is summed with the data of the lower 7 digit numbers of the digital signal. Subsequently, the trailing edge control signal is negated depending on the rising edge of the clock signal B which causes this sum value to correspond to the value of the second count signal. The trailing edge control signal is asserted at the starting point of the second count signal (at a point when the counted value is 0 (zero)).

Additionally, in order to calculate the pulse leading edge position, a value (in this case, {(N+1)×(M−1)−1}=129×4−1) of the first count signal at the same synchronization time is summed with the data of the lower 7 digit numbers of the digital signal. Subsequently, data of the upper remaining 9 digit numbers of the digital signal is subtracted from the sum value. The leading edge control signal is asserted depending on the rising edge of the clock signal A which causes this subtraction value to correspond to the value of the first count signal. The leading edge control signal is negated at end point of the first count signal (at a time when the counted value is 129×5−1).

As described above, when frequency ratio between the clock signal A and the clock signal B is (N+1):N, the phase difference between the clock signal A and the clock signal B recurs with (N+1) cycles. N-step phase difference sequentially appears in units of (one cycle of the clock signal A)/N. By use of this phase difference, the PWM controller 100 is capable of generating the pulse width modulation signal whose unit is (one cycle of the clock signal A)/N. In other words, the PWM controller 100 has a resolution which is N times as high as the resolution of each period of the clock signal received by the PWM controller 100. Consequently, the PWM controller 100 is capable of controlling the pulse width with the resolution which is N times higher than by use of a clock with the same frequency.

[Patent Document 1] Japanese Patent No. 3967370

SUMMARY

The PWM controller 100 described in Patent Document 1 generates the leading edge of the pulse width modulation signal by use of the leading edge control signal, and generates the trailing edge of the pulse width modulation signal by use of the trailing edge control signal, thereby setting up the on period of the pulse width modulation signal. However, a period from the leading edge of the pulse width modulation signal in a certain cycle to the leading edge of the pulse width modulation signal in the next cycle varies depending on the value of the digital signal. This brings about a problem that the PWM controller 100 is incapable of arbitrarily setting up an ON period of the pulse width modulation signal in constant cycles, and accordingly incapable of achieving an arbitrary ON duty ratio in constant cycles required for the switching power supply and the like.

An exemplary aspect of the PWM controller according to the present invention comprises a first counter for counting a reference clock signal, and thus outputting a first count value, a first counter controller for detecting that the first count value reaches a first set value, and thus resetting the first counter, a leading edge control signal generator for detecting that the first count value reaches a second set value, and thus outputting a leading edge control signal specifying a leading edge position of a pulse width modulation signal, an adjustment clock generator for generating an adjustment clock signal having a cycle which is different from that of the reference clock signal, a second counter controller for detecting that the first count value reaches a third set value, and thus instructing the adjustment clock generator to start its output operation, a second counter for counting the adjustment clock signal, and thus outputting a second count value; a trailing edge control signal generator for detecting that the second count value reaches a fourth set value, and thus generating a trailing edge control signal specifying a trailing edge position of the pulse width modulation signal; and a PWM pulse generator for generating a rising edge of the pulse width modulation signal on a basis of the leading edge control signal, and concurrently generating a falling edge of the pulse width modulation signal on a basis of the trailing edge control signal.

Another exemplary aspect of a pulse waveform control method according to the present invention is a pulse waveform control method for a PWM controller for controlling a cycle and pulse width of a pulse width modulation signal on a basis of a reference clock signal and an adjustment clock signal having a cycle which is different from that of the reference clock signal, the method comprising detecting that a first count value obtained by counting the reference clock signal reaches a first set value, and thus resetting the first count value, counting the reference clock signal received after the reset, and thus generating the first count value, detecting that the first count value reaches a second set value, and thus generating a leading edge control signal specifying a leading edge position of the pulse width modulation signal, detecting that the first count value reaches a third set value, and thus starting to output the adjustment clock signal, counting the adjustment clock signal, and thus generating a second count value; detecting that the first count value reaches a fourth set value, and thus generating a trailing edge control signal specifying a trailing edge position of the pulse width modulation signal, and synthesizing the leading edge control signal and the trailing edge control signal, and thus generating the pulse width modulation signal.

Another exemplary aspect of a pulse waveform control method according to the present invention is a pulse waveform control method for a PWM controller for controlling a cycle and pulse width of a pulse width modulation signal on a basis of a reference clock signal and an adjustment clock signal having a cycle which is different from that of the reference clock signal, the method comprising setting up a length of one cycle of the pulse width modulation signal on a basis of the number of clock cycles of the reference clock signal, setting up a leading edge position of the pulse width modulation signal on a basis of the number of clock cycles of the reference clock signal which are included in a time period from a starting position of one cycle of the pulse width modulation signal to a leading edge position of the pulse width modulation signal, setting up a position where the adjustment clock starts to be outputted on a basis of the first count value, and setting up a trailing edge position of the pulse width modulation signal on a basis of the number of clock cycles of the adjustment clock which are included in a time period from the position where the adjustment clock starts to be outputted to the trailing edge position of the pulse width modulation signal.

The PWM controller and pulse waveform control method according to the exemplary aspects of the present invention sets up the timing when the first counter starts its counting operation on the basis of the first set value, and sets up the timing when the second counter starts its counting operation on the basis of the relationship between the first count value and the third set value. In other words, the PWM controller according to the present invention makes it possible to arbitrarily set up a position where the first clock signal and the second clock signal start to be synchronized with each other on the basis of the third set value.

Furthermore, the PWM controller and pulse waveform control method according to the exemplary aspects of the present invention sets up a leading edge position of the pulse width modulation signal on the basis of the first set value and the second set value, and sets up a trailing edge position of the pulse width modulation signal on the basis of the third set value and the fourth set value. In other words, the PWM controller according to the present invention is capable of setting up the leading edge position of the pulse width modulation signal and the trailing edge position thereof independently.

In this way, the PWM controller and pulse waveform control method according to the present invention is capable of generating the leading edge position of the pulse width modulation signal in constant cycles on the basis of only the first clock signal. In addition, the PWM controller and pulse waveform control method makes it possible to arbitrarily set up the relationship between the leading edge position of the pulse width modulation signal and the trailing edge position thereof on the basis of the position where the first clock signal and the second clock signal start to be synchronized with each other. In other words, regardless of the phase difference between the first clock signal and the second clock signal, the PWM controller according to the present invention is capable of generating the pulse width modulation signal whose trailing edge position is arbitrarily located with respect to the leading edge position generated in predetermined cycles.

The PWM controller and pulse waveform controlling method according to the present invention are capable of controlling, with a higher resolution, the ON duty ratio of a pulse width modulation signal having constant cycles.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 7 is a block diagram of a PWM controller of a related art.

DETAILED DESCRIPTION OF THE EXEMPLARY EMBODIMENTS

First Exemplary Embodiment

Figure 1:
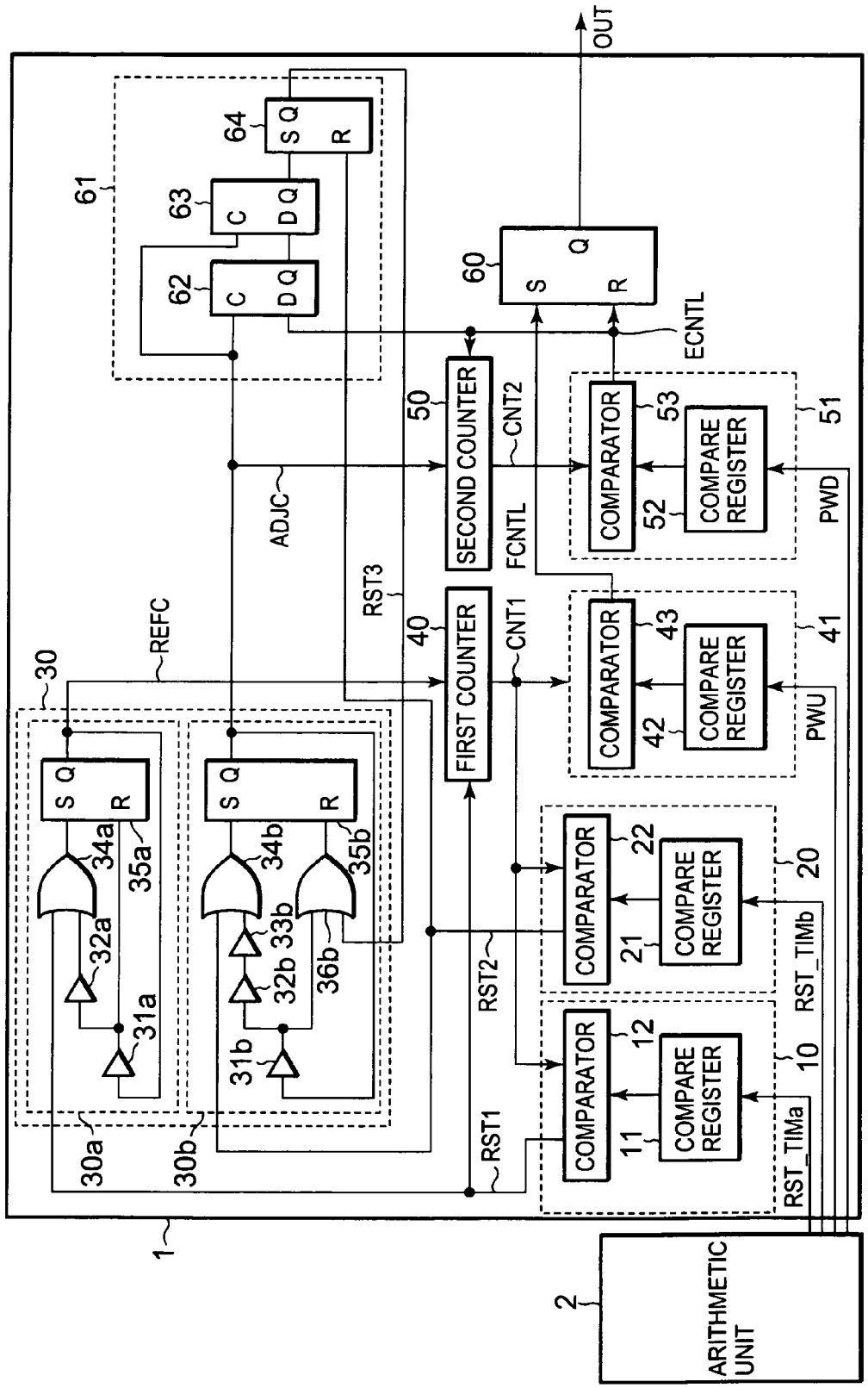
FIG. 1 is a block diagram of a PWM controller according to a first exemplary embodiment.

Descriptions will be hereinafter provided for an exemplary embodiment of the present invention with reference to the drawings. FIG. 1 shows a block diagram of a PWM controller 1 according to a first exemplary embodiment. As shown in FIG. 1, the PWM controller 1 determines the pulse width and cycle of a pulse width modulation signal OUT that the PWM controller 1 outputs on the basis of a first set value (for instance, a reset timing set value RST_TIMa), a second set value (for instance, a leading edge position set value PWU), a third set value (for instance, a second reset timing set value RST_TIMb) and a fourth set value (for instance, a trailing edge position set value PWD) calculated by an arithmetic unit 2. Hereinafter, descriptions will be provided for a detailed configuration of the PWM controller 1 according to the first exemplary embodiment.

The PWM controller 1 includes a first counter controller 10, a second counter controller 20, a clock controller 30, a first counter 40, a second counter 50, a PWM pulse generator 60, and a reset control circuit 61.

The first counter controller 10 detects that a first count value CNT1 outputted by the first counter 40 reaches the first reset timing set value RST_TIMa, and thus outputs a first reset signal RST1. The first reset signal RST1 is sent to the first counter 40, and thus resets the first count value CTN1 outputted by the first counter 40. In addition, the first reset signal RST1 is sent to a reference clock generator 30a in the clock controller 30, and thus resets the phase of a reference clock signal REFC outputted by the reference clock generator 30a.

The first counter controller 10 includes a first register (for instance, a compare register 11) and a first comparator (for instance, a comparator 12). The first reset timing set value RST_TIMa is stored in the compare register 11. The comparator 12 outputs a result of coincidence/comparison between the first count value CNT1 and the first reset timing set value RST_TIMa as the first reset signal RST1. More specifically, the comparator 12 asserts the first reset signal RST1 if the first count value CNT1 coincides with the first reset timing set value RST_TIMa, whereas the comparator 12 negates the first reset signal RST1 if the first count value CNT1 does not coincide with the first reset timing set value RST_TIMa.

The second counter controller 20 detects that the first count value CNT1 outputted by the first counter 40 reaches the second reset timing set value RST_TIMb, and thus outputs a second reset signal RST2. The second reset signal RST2 is sent to an adjustment clock generator 30b in the clock controller 30. The adjustment clock generator 30b starts to output an adjustment clock signal ADJC in response to the second reset signal RST2.

The second counter controller 20 includes a third register (for instance, a compare register 21) and a third comparator (for instance, a comparator 22). The second reset timing set value RST_TIMb is stored in the compare register 21. The comparator 22 outputs a result of coincidence/comparison between the first count value CNT1 and the second reset timing set value RST_TIMb as the second reset signal RST2. More specifically, the comparator 22 asserts the second reset signal RST2 if the first count value CNT1 coincides with the second reset timing set value RST_TIMb, whereas the comparator 22 negates the second reset signal RST2 if the first count value CNT1 does not coincide with the second reset timing set value RST_TIMb.

The clock controller 30 generates the reference clock signal REFC and the adjustment clock signal ADJC which are used in the PWM controller 1. The reference clock signal REFC and the adjustment clock signal ADJC are clock signals each having a different period. A time corresponding to the phase difference between the reference clock signal REFC and the adjustment clock signal ADJC is defined as a control step (resolution) of the pulse width of the pulse width modulation signal OUT. A time corresponding to one resolution is termed as a resolution cycle.

The clock controller 30 includes the reference clock generator 30a and the adjustment clock generator 30b. The reference clock generator 30a includes: delay circuits 31a, 31b; an OR circuit 34a; and a set/reset latch circuit 35a. The input terminal of the delay circuit 31a is connected to the output terminal Q of the set/reset latch circuit 35a, and the output terminal of the delay circuit 31a is connected to the reset terminal R of the set/reset latch circuit 35a. The input terminal of the delay circuit 32a is connected to the output terminal of the delay circuit 31a, and the output terminal of the delay circuit 32a is connected to one of the input terminals of the OR circuit 34a. The one of the input terminals of the OR circuit 34a is connected to the output terminal of the delay circuit 32a, and the first reset signal RST1 is inputted into the other of the input terminals of the OR circuit 34a. The OR circuit 34a performs OR arithmetic on the two inputs, and thus outputs an arithmetic result. The output terminal of the OR circuit 34a is connected to the set terminal S of the set/reset latch circuit 35a; the output terminal of the delay circuit 31a is connected to the reset terminal R of the set/reset latch circuit 35a; and the reference clock signal REFC is outputted from the output terminal Q of the set/reset latch circuit 35a. The set/reset latch circuit 35a sets its output signal at a first logical level (for instance, a high level) when its set terminal S is asserted. In contrast, the set/reset latch circuit 35a sets its output signal at a second logical level (for instance, a low level) when its reset terminal R is asserted. The reference clock generator 30a feeds back the output of the set/reset latch circuit 35a to the set terminal S and the reset terminal R of the set/reset latch circuit 35a through the delay circuits 31a, 31b, and thereby generates the reference clock signal REFC.

The adjustment clock generator 30b includes: delay circuits 31a, 31b; a resolution setting delay circuit 33b; OR circuits 34b, 36b; and a set/reset latch circuit 35b. The input terminal of the delay circuit 31a is connected to the output terminal Q of the set/reset latch circuit 35b. One of the input terminals of the OR circuit 36b is connected to the output terminal of the delay circuit 31b, and a clock stop signal RST3 is inputted into the other of the input terminals of the OR circuit 36b. The output terminal thereof is connected to one of the terminals of the OR circuit 36b. The OR circuit 36b performs OR arithmetic on the two inputs, and thus outputs the arithmetic result to the reset terminal R of the set/reset latch circuit 35b.

The input terminal of the delay circuit 32b is connected to the output terminal of the delay circuit 31b, and the output terminal of the delay circuit 32b is connected to the input terminal of the resolution setting delay circuit 33b. The input terminal of the resolution setting delay circuit 33b is connected to the output terminal of the delay circuit 32b, and the output terminal of the resolution setting delay circuit 33b is connected to one of the input terminals of the OR circuit 34b.

The one of the input terminals of the OR circuit 34b is connected to the output terminal of the resolution setting delay circuit 33b, and the second reset signal RST2 is inputted into the other of the input terminals of the OR circuit 34b. The OR circuit 34b performs OR arithmetic on the two inputs, and thus outputs the arithmetic result.

The output terminal of the OR circuit 34b is connected to the set terminal S of the set/reset latch circuit 35b; the output terminal of the OR circuit 36b is connected to the reset terminal R of the set/reset latch circuit 35b; and the adjustment clock signal ADJC is outputted from the output terminal Q of the set/reset latch circuit 35b. When its set terminal S is asserted, the set/reset latch circuit 35b sets its output signal at a high level. When its reset terminal R is asserted, the set/reset latch circuit 35b sets its output signal at a low level. The adjustment clock generator 30b feeds back the output of the set/reset latch circuit 35b to the set terminal S and the reset terminal R of the set/reset latch circuit 35b through the delay circuits 31b, 32b, 33b, and thereby generates the adjustment clock signal ADJC.

In this respect, the delay time of the delay circuit 31a is equal to that of the delay circuit 31b, and the delay time of the delay circuit 32a is equal to that of the delay circuit 32b. This makes the time of one cycle of the adjustment clock signal ADJC longer than the time of one cycle of the reference clock signal REFC by the delay time of the resolution setting delay circuit 33b. In other words, the reference clock signal REFC and the adjustment clock signal ADJC are clock signals each having a different period.

The first counter 40 counts the reference clock signal REFC, and thus outputs the first count value CNT1. The first counter 40 increments the count value for each rising edge of the reference clock signal REFC, and thereby counts the number of clock cycles of the reference clock signal REFC. In addition, the first reset signal RST1 is inputted into the first counter 40. When the first reset signal RST1 is asserted, the first count value CNT1 is reset.

The second counter 50 counts the adjustment clock signal ADJC, and thus outputs the second count value CNT2. The second counter 50 increments the count value for each rising edge of the adjustment clock signal ADJC, and thereby counts the number of clock cycles of the adjustment clock signal ADJC. In addition, a trailing edge control signal ECNTL, albeit described later, is inputted into the second counter 50. When the trailing edge control signal ECNTL is asserted, the second count value CNT2 is reset.

A leading edge control signal generator 41 detects that the first count value CNT1 outputted by the first counter 40 reaches the leading edge position set value PWU, and thus outputs a leading edge control signal FCNTL. The leading edge control signal FCNTL is sent to the PWM pulse generator 60. The leading edge control signal generator 41 includes a second register (for instance, a compare register 42) and a second comparator (for instance, a comparator 43). The leading edge position set value PWU is stored in the compare register 42. The comparator 43 outputs a result of coincidence/comparison between the first count value CNT1 and the leading edge position set value PWU as the leading edge control signal FCNTL. More specifically, the comparator 43 asserts the leading edge control signal FCNTL if the first count value CNT1 coincides with the leading edge position set value PWU, whereas the comparator 43 negates the leading edge control signal FCNTL if the first count value CNT1 does not coincide with the leading edge position set value PWU.

A trailing edge control signal generator 51 detects that the second count value CNT2 outputted by the second counter 50 reaches the trailing edge position set value PWD, and thus outputs a trailing edge control signal ECNTL. The trailing edge control signal ECNTL is sent to the PWM pulse generator 60. The trailing edge control signal generator 51 includes a fourth register (for instance, a compare register 52) and a fourth comparator (for instance, a comparator 53). The trailing edge position set value PWD is stored in the compare register 52. The comparator 53 outputs a result of coincidence/comparison between the second count value CNT2 and the trailing edge position set value PWD as the trailing edge control signal ECNTL. More specifically, the comparator 53 asserts the trailing edge control signal ECNTL if the first count value CNT1 coincides with the trailing edge position set value PWD, whereas the comparator 53 negates the trailing edge control signal ECNTL if the first count value CTN1 does not coincide with the trailing edge position set value PWD.

The PWM pulse generator 60 generates a rising edge of the pulse width modulation signal OUT on the basis of the leading edge control signal FCNTL, and generates a falling edge of the pulse width modulation signal OUT on the basis of the trailing edge controls signal ECNTL. In other words, the PWM pulse generator 60 synthesizes the leading edge control signal FCNTL and the trailing edge control signal ECNTL, and thereby shapes the waveform of the pulse width modulation signal OUT which constitutes an output signal.

The reset control circuit 61 monitors the condition of the trailing edge control signal ECNTL, and thus stops the operation of the adjustment clock generator 30b. The reset control circuit 61 includes: a D flip-flop 62, 63; and a set/reset latch circuit 64. In the present exemplary embodiment, the D flip-flop 62 receives the adjustment clock signal ADJC through its clock input terminal C, and receives the trailing edge control signal ECNTL through its data input terminal D. When receiving the rising edge of the adjustment clock signal ADJC, the D flip-flop 62 outputs the current logical level of the trailing edge control signal ECNTL from its output terminal Q. The D flip-flop 63 receives the adjustment clock signal ADJC through its clock input terminal C, and receives the output of the latch circuit 62 through its data input terminal D. When receiving the rising edge of the adjustment clock signal ADJC, the D flip-flop outputs the current logical level of the output of the D flip-flop 62 from its output terminal Q. The set/reset latch circuit 64 receives the output of the D flip-flop 63 through its set terminal S, and receives the second reset signal RST2 through its reset terminal R. When the rising edge is inputted into its set terminal S, the set/reset latch circuit 64 asserts the output signal (the clock stop signal RST3) which it outputs from its output terminal Q. When the rising edge is inputted into the reset terminal R, the set/reset latch circuit 64 negates the output signal (the clock stop signal RST3) outputted from its output terminal Q. Note that the reset control circuit 61 serves a function of stopping the adjustment clock signal ADJC after the output of the trailing edge control signal ECNTL, and thus preventing malfunction after the generation of the trailing edge control signal ECNTL.

In the first exemplary embodiment, the PWM pulse generator 60 is configured of a set/reset latch circuit. In the set/reset latch circuit used for the PWM pulse generator 60, the leading edge control signal FCNTL is inputted into its set terminal S; the trailing edge control signal ECNTL is inputted into its reset terminal R; and the pulse width modulation signal OUT is outputted from its output terminal Q. This set/reset latch circuit-switches the level of the pulse width modulation signal OUT to its high level when the leading edge control signal FCNTL is asserted, and thereby generates the rising edge of the pulse width modulation signal OUT. In contrast, this set/reset latch circuit switches the level of the pulse width modulation signal OUT to its low level when the trailing edge control signal ECNTL is asserted, and thereby generates the falling edge of the pulse width modulation signal OUT.

Specifically, the PWM controller 1 according to the exemplary embodiment sets up the leading edge position of the pulse width modulation signal OUT at a timing when the leading edge control signal FCNTL is asserted, and sets up the trailing edge position of the pulse width modulation signal OUT at a timing when the trailing edge control signal ECNTL is asserted. The timing when the leading edge control signal FCNTL is asserted and the timing when the trailing edge control signal ECNTL is asserted are set up on the basis of the first reset timing set value RST_TIMa, the second reset timing set value RST_TIMb, the leading edge position set value PWU and the trailing edge position set value PWD. Hereinafter, descriptions will be provided for how these values are calculated.

Figure 2:
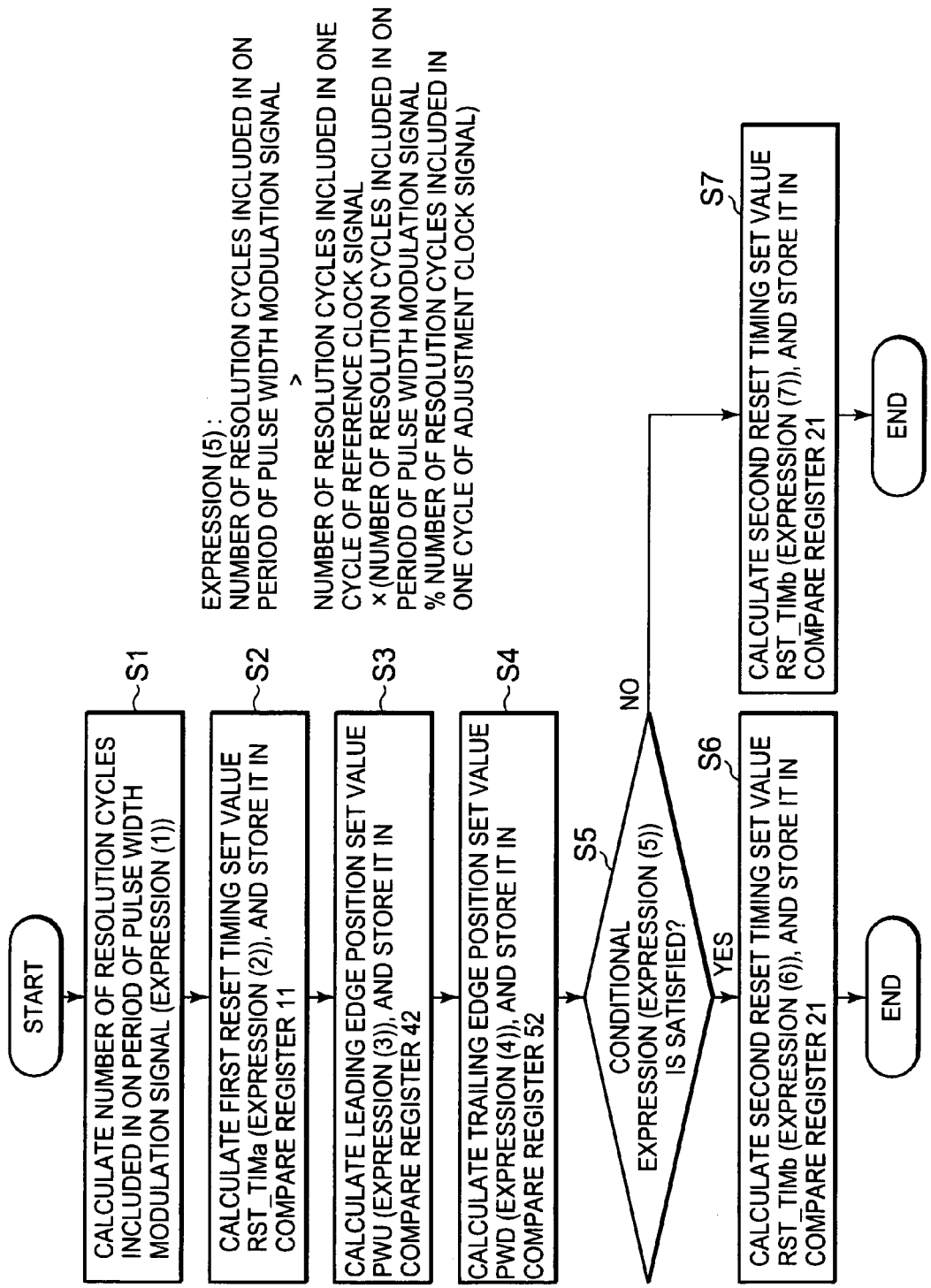
FIG. 2 is a flowchart showing an arithmetic procedure for set values used in the PWM controller according to the first exemplary embodiment.

FIG. 2 shows a flowchart showing a procedure to calculate the values used for the exemplary embodiment. In the exemplary embodiment, all the values are calculated by the arithmetic unit 2. In other words, the procedure shown by the flowchart of FIG. 2 is carried out by the arithmetic unit 2.

As shown in FIG. 2, before these values are found, first of all, the number ONres of resolution cycles included in an ON period of the pulse width modulation signal OUT (for instance, in a time period for which the pulse width modulation signal OUT is kept at the high level) is calculated (in step S1). The number ONres of resolution cycles included in the ON period is found on the basis of Expression (1).

$$ONres = PWMon/RES \quad (1)$$

where PWMon denotes a time length of the ON period of the pulse width modulation signal OUT, and RES denotes a time length of one resolution cycle.

Subsequently, the first reset timing set value RST_TIMa is calculated, and the calculated first reset timing set value RST_TIMa is stored in the compare register 11 (in step S2). The first reset timing set value RST_TIMa is found on the basis of Expression (2).

$$RST\_TIMa = (PWMres/CK1res) - 1 \quad (2)$$

where PWMres denotes the number of resolution cycles included in one cycle of the pulse width modulation signal OUT, and CK1*res* denotes the number of resolution cycles included in one cycle of the reference clock signal REFC. In the present exemplary embodiment, the first counter 40 counts the number of clock cycles with an initial value of 0 (zero). For this reason, in Expression (2), the last term representing 1 (one) is subtracted from the term (PWMres/CK1*res*). In other words, the value represented by the last term which is subtracted from the term (PWMres/CK1*res*) may be determined depending on the initial value of the first counter 40. As learned from Expression (2), the first reset timing set value RST_TIMa is a value for determining the time length of one cycle of the pulse width modulation signal OUT, or a value for setting up the number of clock cycles of the reference clock signal REFC which are included in one cycle of the pulse width modulation signal OUT.

Thereafter, the leading edge position set value PWU is calculated, and the calculated leading edge position set value PWU is stored in the compare register 42 (in step S3). The leading edge position set value PWU sets up the number of cycles of the reference clock signal REFC, the cycles included in a time period from the starting position of one cycle of the pulse width modulation signal OUT to the leading edge position of the pulse width modulation signal OUT. Specifically, the leading edge position set value PWU sets up that the leading edge position of the pulse width modulation signal OUT is synchronized with what clock cycle of the reference clock signal REFC after the reset of the first counter so as to be outputted. In the exemplary embodiment, the leading edge position set value PWU is set at 0 (zero) which is equal to the initial value of the first counter 40 because the leading edge position of the pulse width modulation signal OUT is set up at the start of the cycle. For this reason, the leading edge position set vale PWU is found on the basis of Expression (3).

$$PWU=1 \qquad (3)$$

Subsequently, the trailing edge position set value PWD is calculated, and the calculated trailing edge position set value PWD is stored in the compare register 52 (in step S4). The trailing edge position set value PWD is found on the basis of Expression (4).

$$PWD=(ONres\%CK1res)+1 \qquad (4)$$

where % indicates a remainder arithmetic. Specifically, the trailing edge position set value PWD is set up on the basis of a result of the remainder arithmetic performed on the number ONres of resolution cycles included in the On period and the number CK1res of resolution cycles included in one cycle of the reference clock signal REFC. In addition, the trailing edge position set value PWD is set up on the basis of the number of clock cycles of the adjustment clock signal ADJC which are included in a time period from the starting position of the adjustment clock signal ADJC to the trailing edge position of the pulse width modulation signal. In the exemplary embodiment, the initial value of the second counter is 0 (zero), and the value counting the number of clock cycles of the adjustment clock signal which is inputted to initialize the second counter is defined as the second count value CNT2. Furthermore, in the exemplary embodiment, the trailing edge position of the pulse width modulation signal OUT is determined by synchronizing the trailing edge position thereof with the rising edge of the trailing edge control signal ECNTL. For this reason, in Expression (4), 1 (one) represented by the last term is added to the preceding term (Onres%CK1res). Specifically, the value represented by the last term which is added to the preceding term in Expression (4) may be determined on the basis of the operation of the second counter 50 as well as the leading edges respectively of the trailing edge control signal ECNTL and the pulse width modulation signal.

Thereafter, the second reset timing set value RST_TIMb is calculated. The value of the second reset timing set value RST_TIMb varies depending on the length of the ON period of the pulse width modulation signal. In the exemplary embodiment, a scheme of calculating the second reset timing set value RST_TIMb is chosen depending on whether or not a conditional expression of Expression (5) is satisfied (in step S5).

$$ONres>CK2res\times(ONres\%CK1res) \qquad (5)$$

where CK2res denotes the number of resolution cycles included in one cycle of the adjustment clock signal ADJC. The conditional expression in the left term of Expression (5) calculates how many clock cycles of the adjustment clock signal ADJC are needed for a fine adjustment of the ON period on the basis of the result of the remainder arithmetic performed on the number of resolution cycles included in the ON period and the resolution cycles included in one cycle of the reference clock signal REFC, and thus finds the length of the adjustment clock signal which corresponds to the calculated number of clock cycles thereof. Afterward, it is judged whether or not the length of the adjustment clock signal ADJC of the left term is longer than the ON period.

If the conditional expression of expression (5) is satisfied so that it is determined as true (Yes), then the second reset timing set value RST_TIMb is calculated by Expression (6), and the calculated second reset timing set value RST_TIMb is stored in the compare register 21 (in step S6).

$$RST\_TIMb=(ONres-(CK2res\times(ONres\%CK1res)))/CK1res \qquad (6)$$

ON the other hand, if the conditional expression of expression (5) is not satisfied so that it is determined as false (No), then the second reset timing set value RST_TIMb is calculated by Expression (7), and the calculated second reset timing set value RST_TIMb is stored in the compare register 21 (in step S7).

$$RST\_TIMb=PWMck1-((CK2res\times(ONres\%CK1res)-ONres)/CK1res) \qquad (7)$$

where PWMck1 denotes the number of clock cycles of the reference clock signal REFC which are included in one cycle of the pulse width modulation signal.

The second reset timing set value RST_TIMb found on the basis of Expression (6) is a value for outputting the second reset signal RST2 after the cycle of the pulse width modulation signal which is controlled by the second reset timing set value RST_TIMb starts (or after the first counter 40 is reset). On the other hand, the second reset timing set value RST_TIMb found on the basis of Expression (7) is a value for outputting the second reset signal RST2 before the cycle of the pulse width modulation signal which is controlled by the second reset timing set value RST_TIMb starts (or before the first counter 40 is reset).

The second reset timing set value RST_TIMb is set up on the basis of the number of clock cycles of the reference clock signal REFC which are obtained from the difference between the number of resolution cycles of the adjustment clock signal ADJC and the number of resolution cycles included in the ON period of the pulse width modulation signal OUT. Here, the number of resolution cycles of the adjustment clock signal ADJC is obtained from the result of the remainder arithmetic performed on the number of resolution cycles included in the ON period of the pulse width modulation signal OUT and the number of resolution cycles included in one cycle of the reference clock signal REFC. In addition, the second reset timing set value RST_TIMb sets up the value represented by the first count value CNT1 for starting to output the adjustment clock.

Figure 3:
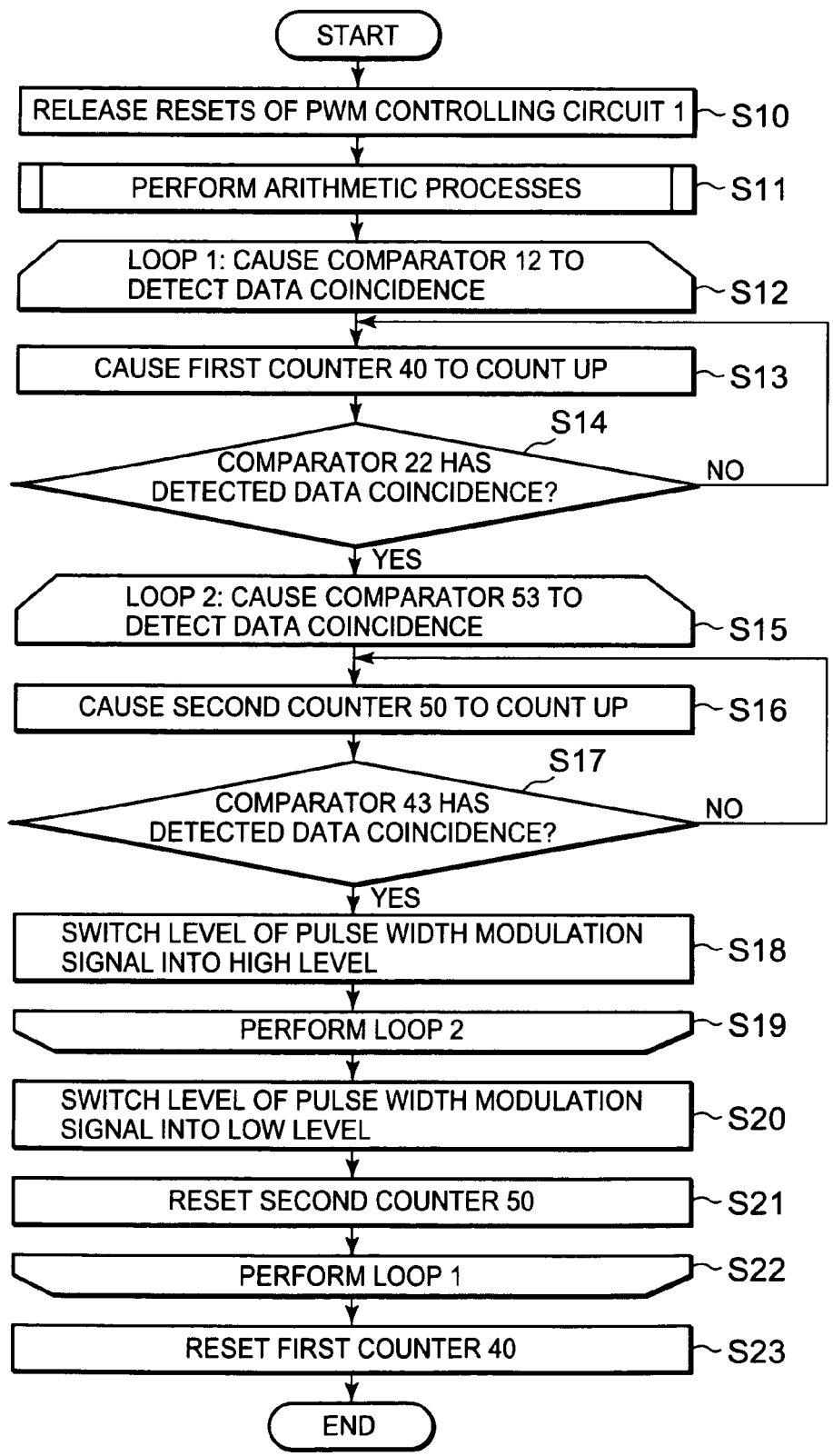
FIG. 3 is a flowchart showing how the PWM controller according to the first exemplary embodiment operates.

Subsequently, descriptions will be provided the way to operate the PWM controller 1 of the exemplary embodiment. The PWM controller 1 shapes the waveform of the pulse width modulation signal OUT on the basis of the values which the arithmetic unit 2 calculates on the above-described steps S1 to S7. With this taken into consideration, FIG. 3 shows a flowchart showing a procedure with which the PWM controller 1 operates. The PWM controller 1 performs the flowchart shown in FIG. 3 for every cycle of the pulse width modulation signal OUT.

First of all, the PWM controller 1 releases the resets before a cycle of the pulse width modulation signal OUT which the PWM controller 1 is going to generate starts (in step S10). Thereby, the compare registers 11, 21, 42, 52 and the comparators 12, 22, 43, 53 are in an initialized condition. Subsequently, the arithmetic unit 2 performs the steps S1 to S7, and thereby calculates the first reset timing set value RST_TIMa, the second reset timing set value RST_TIMb, the leading edge position set value PWU, and the trailing edge position set value PWD. Thus, the calculated values are respectively stored in the compare registers 11, 21, 42, 52 (in step S11). In this way, the PWM controller 1 completes the set up of the condition for the operation.

Thereafter, the PWM controller 1 starts a process of shaping the waveform of one cycle of the pulse width modulation signal OUT as Process Loop 1 (in step S12). Process Loop 1 repeatedly performs an operation from step S13 through step S22 until the comparator 12 of the first counter controller 10 detects coincidence between the first reset timing set value RST_TIMa and the first count value CNT1. Additionally in the process included in Process Loop 1, the leading edge portion and trailing edge portion of the pulse width modulation signal OUT are generated.

In Process Loop 1, the first counter 40 counts the number of clock cycles of the reference clock signal REFC, and thus counts up the first count value CNT1 (in step S13). Afterward, when the comparator 22 of the second counter controller 20 detects coincidence between the second reset timing set value RST_TIMb and the first count value CNT1, the process for Process Loop 2 starts (in step S14). When the comparator 22 detects the value coincidence in step S14, the comparator 22 asserts the second reset signal RST2. Thus, the adjustment clock signal ADJC starts to be outputted. Note that Process Loop 2 is performed in parallel with Process Loop 1, and that the first counter 40 continues to be counted up while the Process Loop 2 is being performed.

Process Loop 2 repeatedly performs an operation from step S16 to step S19 until the comparator 53 of the trailing edge control signal generator 51 detects coincidence between the trailing edge position set value PWD and the second count signal (in step S15). In Process Loop 2, the second counter 50 counts the number of clock cycles of the adjustment clock signal ADJC, and thus counts up the second count value CNT2 (in step S16). When the comparator 43 of the leading edge control signal generator 41 detects coincidence between the leading edge position set value PWU and the first count value CNT1 (in step S17), the leading edge control signal FCNTL is asserted. Thereby, the PWM pulse generator 60 switches the level of the pulse width modulation signal OUT into the high level. Thus, this rising edge of the pulse width modulation signal OUT constitutes the leading edge portion of the pulse width modulation signal OUT (in step S18).

After that, when the comparator 53 detects the coincidence between the trailing edge position set value PWD and the second count signal, Process Loop 2 is completed (in step S19). When the comparator 53 detects the coincidence between the trailing edge position set value PWD and the second signal in step S19, the comparator 53 asserts the trailing edge control signal ECNTL. Thereby, the PWM pulse generator 60 switches the level of the pulse width modulation signal OUT into the low level, and thus this falling edge of the pulse width modulation signal OUT constitutes the trailing edge portion of the pulse width modulation signal OUT (in step S20). In addition, when the trailing edge control signal ECNTL is asserted, the counter 50 is in a reset condition (in step S21).

Subsequently, when the comparator 12 of the first counter controller 10 detects the coincidence between the first reset timing set value RST_TIMa and the first count value CNT1, Process Loop 1 is completed (in step S22). At this time, the comparator 12 asserts the first reset signal RST1. Thereby, the first counter 40 is in a reset condition (in step S23). Through the above-described operation, generation of one cycle of the pulse width modulation signal OUT is completed.

Figure 4:
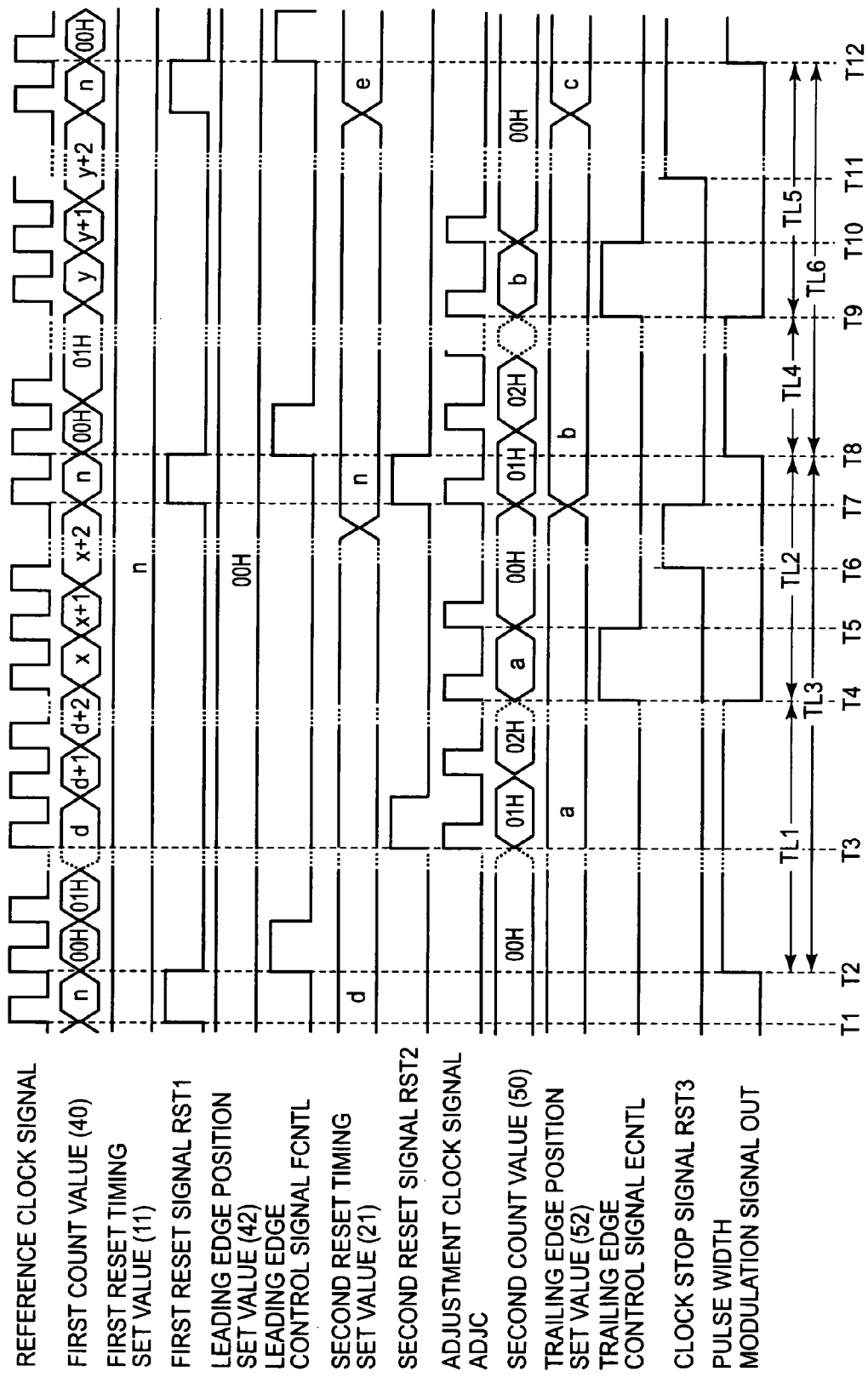
FIG. 4 is a timing chart showing how the PWM controller according to the first exemplary embodiment operates.

From now on, descriptions will be provided for how the PWM controller 1 operates with reference to FIG. 4, which shows an example of a timing chart with which the PWM controller 1 operates in accordance with the flowchart shown in FIGS. 2 and 3. Note that in the example shown in FIG. 4, time periods TL1, TL4 indicate a time length of the ON period of the pulse width modulation signal OUT; Time Periods TL2, TL5 indicate a time length of the OFF period of the pulse width modulation signal OUT; and time periods TL3, TL6 indicate a time length of one cycle of the pulse width modulation signal OUT. In the example shown in FIG. 4, two cycles of the pulse width modulation signal OUT are shown in FIG. 4.

Let us assume that the two cycles of this pulse width modulation signal OUT are equal to each other in time length (for instance, time period TL3=time period TL6=300 nsec), and that a leading edge portion of the pulse width modulation signal OUT is located at a starting position of each cycle thereof In addition, the duty ratio of one of the two cycles of the pulse width modulation signal OUT is different from the duty ratio of the other of the two cycles thereof. Let us assume that, for example, a section of the pulse width modulation signal whose cycle corresponds to time period TL3 has an ON duty ratio (a duty ratio during the ON period (TL1/TL3)) of 13.4% (40.2 nsec). On the other hand, let us assume that a section of the pulse width modulation signal whose cycle corresponds to time period TL6 has an ON duty ratio (TL4/TL6) of 13.5% (40.5 nsec). Additionally in the example shown in FIG. 4, let us assume that the time of one cycle of the reference clock signal REFC is 10 nsec, one cycle of the adjustment clock signal ADJC is 10.1 nsec, and one resolution cycle is 100 psec.

Under these conditions, the set values in time period TL3 are as follows. On the basis of Expression (2), the first reset timing set value is calculated as RST_TIMa=(3000/100)−1=29. On the basis of Expression (3), the leading edge position set value is calculated as PWU=0. On the basis of Expression (4), the trailing-edge position set value is calculated as PWD=(402%100)+1=3. On the basis of Expression (6), the second reset timing set value is calculated as RST_TIMb=402−(101×(405%100))/100=2. Consequently, values n, d and a shown in FIG. 4 are 29, 2 and 3, respectively.

In addition, the set values in time period TL6 are as follows. The first reset timing set value RST_TIMa and the leading edge position set value PWU are the same values as those in time period TL3, because the cycle of the pulse width modulation signal OUT and the leading edge position of the pulse width modulation signal OUT are constant. On the other hand, on the basis of Expression (4), the trailing edge position set value is calculated as PWD=(405%100)+1=6. On the basis of Expression (7), the second reset timing set value is calculated as RST_TIMAb=(3000/100)−(((101×(405%100))−405)/100=29. Consequently, values n and b shown in FIG. 4 are 29 and 6, respectively. Note that values x, y, e and c shown in FIG. 4 are natural numbers. Furthermore, the arithmetic unit 2 performs arithmetic on each of the set values during the OFF period of the pulse width modulation signal OUT (or while the pulse width modulation signal OUT is at the low level), and the calculated set values are respectively stored in the corresponding registers (in steps S10, S11 in FIG. 3).

As shown in FIG. 4, first of all, at timing T1, when the first count value CNT1 reaches n=29 and coincides with the first reset timing set value RST_TIMa=n=29, the comparator 12 of the first counter controller 10 asserts the first reset signal RST1. Thereby, the first count value CNT1 is reset at 0 (zero) (00H in the hexadecimal notation) at timing T2. At this time, because the leading edge position set value PWU=00H=0, the comparator 43 of the leading edge control signal generator 41 asserts the leading edge control signal FCNTL, and thus the leading edge portion of the pulse width modulation signal OUT is formed. The operation performed at timing T2 corresponds to the processes performed in steps S17, S18 in FIG. 3.

Subsequently, the first count value CNT1 is counted up in response to the progress of clock cycles of the reference clock signal REFC (which corresponds to the process performed in step S13 in FIG. 3). Thereafter, at timing T3, when the first count value CNT1 reaches 2 (02H in the hexadecimal notation) and coincides with the second reset timing set value RST_TIMb=d=2, the comparator 22 of the second counter controller 20 asserts the second reset signal RST2. In response to this rising edge of the second reset signal RST2, the adjustment clock generator 30b starts to output the adjustment clock signal ADJC. In addition, the second counter 50 starts to count the number of clock cycles of the adjustment clock signal ADJC, and thus counts up the second count value CNT2 (which corresponds to the process performed in step S16 in FIG. 3).

Afterward, at timing T4, the second count value CNT2 reaches a=3, and thus coincides with the trailing edge position set value PWD=a=3. In response to this value coincidence, the comparator 53 of the trailing edge control signal generator 51 asserts the trailing edge control signal ECNTL. In response to this rising edge of the trailing edge control signal ECNTL, the trailing edge portion of the pulse width modulation signal OUT is formed (which corresponds to the process performed in the step S20 in FIG. 3). In addition, at timing T4, the D flip-flop 62 latches the logical level of the trailing edge control signal ECNTL with the adjustment clock signal ADJC in response to the assertion of the trailing edge control signal ECNTL.

After that, at timing T5, when the second count value CNT2 does not coincide with the trailing edge position set value PWD, the trailing edge control signal ECNTL is negated. In response to the negation of the trailing edge control signal ECNTL, the second counter 50 is reset, and thus the second count value CNT2 is set at 0 (zero) (00H in the hexadecimal notation) (which corresponds to the process performed in step S21 in FIG. 3). In addition, at timing T5, the D flip-flop 63 latches the output from the D flip-flop 62, the level of which output is switched into the high level at timing T4, with the adjustment clock signal ADJC. Subsequently, at timing T6, the clock stop signal RST3 outputted by the set/reset latch circuit 64 is asserted, and thus the adjustment clock generator 30b stops. Thereby, no adjustment clock signal ADJC is outputted from the adjustment clock generator 30b at and after timing T6. Note that when the second reset signal RST2 rises at timing T7, the clock stop signal RST3 is reset in response to the rise, and thus is negated (or the level of the clock stop signal RST3 is switched into the low level).

Afterward, the first counter 40 continues counting the number of clock cycles of the reference clock signal REFC. When the first count value CNT1 reaches n=29, generation of the pulse width modulation signal OUT corresponding to time period TL3 is completed. In the present exemplary embodiment, the pulse width modulation signal OUT corresponding to time period TL3 is generated until timing T8, and subsequently the pulse width modulation signal OUT corresponding to time period TL6 starts to be generated at timing T8.

In the pulse width modulation signal OUT corresponding to time period TL6, the second reset timing set value is calculated as RST_TIMb=n=29. For this reason, at timing T7, when the first count value CNT1 reaches 29, the second reset signal RST2 is asserted in response to this. Additionally, in response to the rise of the second reset signal RST2 at timing T7, the adjustment clock generator 30b starts to output the adjustment clock signal ADJC, and the second counter 50 thus starts to count up the second count value CNT2 (which corresponds to the process performed in step S16 in FIG. 3).

In addition, because the first reset timing set value RST_TIMa=n=29 and the first count value CNT1=n=29 coincide with each other at timing T7, the comparator 12 of the first counter controller 10 asserts the first reset signal RST1. In response to the assertion of the first reset signal RST1, the first count value CTN1 is reset at 0 (zero) at timing T8. At this time, because the leading edge position set value PWU=00H=0, the comparator 43 of the leading edge control signal generator 41 asserts the leading edge control signal FCNTL, and thus the leading edge portion of the pulse width modulation signal OUT is formed. The operation performed at timing T8 corresponds to the processes performed in steps S17, S18 in FIG. 3.

Subsequently, the first count value CNT1 and the second count value CNT2 continue being counted up. At timing T9, the second count value CNT2 reaches b=6, and coincides with the trailing edge position set value PWD=b=6. In response to the value coincidence, the comparator 53 of the trailing edge control signal generator 51 asserts the trailing edge position control signal. In response to this rising edge of the trailing edge control signal ECNTL, the trailing edge portion of the pulse width modulation signal OUT is formed (which corresponds to the process performed in step S20 in FIG. 3). Additionally, in response to the assertion of the trailing edge control signal ECNTL, the D flip-flop 62 latches the logical level of the trailing edge control signal ECNTL with the adjustment clock signal ADJC.

Thereafter, at timing T10, when the second count value CNT2 does not coincide with the trailing edge position set value PWD, the trailing edge control signal ECNTL is negated. In response to the negation of the trailing edge control signal ECNTL, the second counter 50 is reset, and thus the second count value CNT2 is set at 0 (zero) (00H in the hexadecimal notation) (which corresponds to the process performed in step S21 in FIG. 3). In addition, at timing T10, the D flip-flop 63 latches the output from the D flip-flop 62, the level of which output is switched into the high level at timing T9, with the adjustment clock signal ADJC. After that, at timing T11, the clock stop signal RST3 outputted by the set/reset latch circuit 64 is asserted, and thus the adjustment clock generator 30b stops. Thereby, no adjustment clock signal ADJC is outputted from the adjustment clock generator 30b at and after timing T6.

Afterward, the first counter 40 continues counting the number of clock cycles of the reference clock signal REFC. At timing T12, when the first count value CNT1 reaches n=29, generation of the pulse width modulation signal OUT corresponding to time period TL6 is completed.

As described above, the PWM controller 1 of the exemplary embodiment starts to output the adjustment clock signal ADJC depending on the value represented by the first count value CNT1 obtained by counting the reference clock signal REFC. In other words, the PWM controller 1 starts to output the adjustment clock signal ADJC in synchronism with an arbitrary clock cycle of the reference clock signal REFC. Specifically, the leading edge position of the pulse width modulation signal OUT generated by the PWM controller 1 is set up on the basis of the number of clock cycles of the adjustment clock signal ADJC, whereas the trailing edge position of the pulse width modulation signal OUT is set up on the basis of the number of cycles of the reference clock signal REFC for starting the output of the adjustment clock signal ADJC and the number of clock cycles of the adjustment clock signal ADJC. Thereby, the PWM controller 1 is capable of generating, as the resolution of the duty ratio, the pulse width modulation signal OUT which has the time difference of one cycle between the reference clock signal REFC and the adjustment clock signal ADJC. In addition, the PWM controller 1 makes it possible to arbitrarily set up a position where the reference clock signal REFC and the adjustment clock signal ADJC starts to be synchronized with each other. For this reason, even if either of the leading edge position or the position the trailing edge of the pulse width modulation signal OUT is fixed, the PWM controller 1 is capable of controlling the duty ratio of the pulse width modulation signal OUT depending on the resolution.

The pulse width modulation signal OUT thus generated can achieve the duty ratio different from that of constant cycles. This pulse width modulation signal OUT is employed, for instance, as driving pulses of a PID (Power Intelligent Device) which is used as a switching element in a switching power supply. In the switching power supply, the duty ratio of the driving pulses needs to be controlled depending on the power supply condition while driving the PID with its constant cycles. For this reason, the pulse width modulation signal OUT generated by the PWM modulation controller 1 according to the present exemplary embodiment is most suitable to be used for the switching power supply.

Furthermore, the duty ratio of the pulse width modulation signal OUT generated by the PWM controller 1 according to the present exemplary embodiment is controlled by use of a minimum control step (resolution) which is defined by the time difference of one cycle between the reference clock signal REFC and the adjustment clock signal ADJC. For this reason, when the resolution of controlling the duty ratio of the pulse width modulation signal OUT is enhanced, neither the frequency of the reference clock signal REF nor the frequency of the adjustment clock signal ADJC needs to be increased. In other words, the PWM controller 1 according to the present exemplary embodiment is capable of controlling the duty ratio thereof with a higher resolution by use of the reference clock signal REFC and the adjustment clock signal ADJC which have their lower frequencies. This makes it possible to reduce the operating frequency of the PWM controller 1, and accordingly to suppress the power consumption of the PWM controller 1.

Second Exemplary Embodiment

A PWM controller 1*a* according to a second exemplary embodiment corresponds to independent control of an ON transistor and an OFF transistor which operate complementarily with each other. To this end, the PWM controller 1*a* generates a pulse width modulation signal OUT1 and an inverted pulse width modulation signal OUT2. Note that the pulse width modulation signal OUT1 is equivalent to the pulse width modulation signal OUT.

Figure 5:
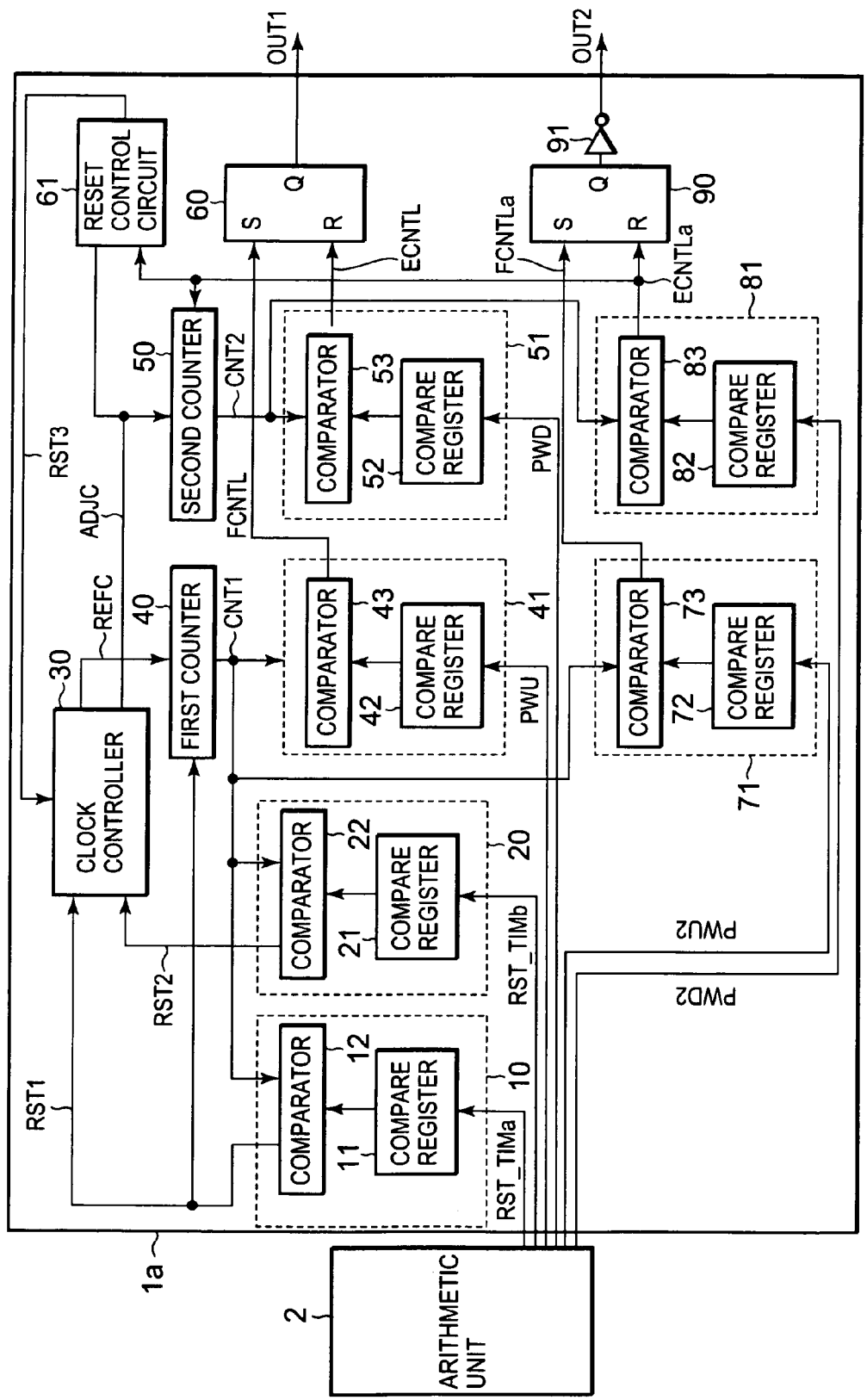
FIG. 5 is a block diagram of a PWM controller according to a second exemplary embodiment.

FIG. 5 shows a block diagram of the PWM controller 1*a* according to the second exemplary embodiment. Incidentally, in the following descriptions, components which are the same as those of the PWM controller 1 according to the first exemplary embodiment will be denoted by the same reference numerals, and duplicated explanation will be omitted. As shown in FIG. 5, the PWM controller 1*a* additionally includes an off-switch leading edge control signal generator 71, an off-switch trailing edge control signal generator 81, an off-switch PWM pulse generator 90 and an inverter 91.

The off-switch leading edge control signal generator 71 asserts an off-switch leading edge control signal FCNTLa at a position located before the position where the leading edge control signal generator 41 asserts the leading edge control signal FCNTL. The off-switch leading edge control signal generator 71 includes a compare register 72 and a comparator 73. The compare register 72 receives an off-switch leading edge position set value PWU2 from the arithmetic unit 2, and this value is stored in the compare register 72. The comparator 73 outputs a result of coincidence/comparison between the off-switch leading edge position set value PWU2 and the first count value CNT1 as the off-switch leading edge control signal FCNTLa.

The off-switch trailing edge control signal generator 81 includes a compare register 82 and a comparator 83. The compare register 82 receives an off-switch trailing edge position set value PWD2 from the arithmetic unit 2, and this value is stored in the compare register 82. The comparator 83 outputs a result of coincidence/comparison between the off-switch trailing edge position set value PWD2 and the second count value CNT2 as an off-switch trailing edge control signal ECNTLa.

The off-switch PWM pulse generator 90 is configured, for instance, of a set/reset latch circuit. The off-switch leading edge control signal FCNTLa is inputted into the set terminal S of the set/reset latch circuit used for the off-switch PWM pulse generator 90, and the off-switch trailing edge control signal ECNTLa is inputted into the reset terminal R. The off-switch PWM pulse generator 90 outputs the inverted pulse width modulation signal OUT2 by inverting a signal outputted from its output terminal Q by use of the inverter 91. This set/reset latch circuit switches the level of the output signal outputted from its output terminal Q into the high level when the off-switch leading edge control signal FCNTLa is asserted, and switches the level of the output signal outputted from its output terminal Q into the low level when the off-switch trailing edge control signal ECNTLa is asserted. Subsequently, this output signal is inverted by the inverter 91. In other words, the rising edge of the inverted pulse width modulation signal OUT2 which is formed at a position where the off-switch leading edge control signal FCNTLa is asserted constitutes the leading edge of the inverted pulse width modulation signal OUT2; the falling edge of the inverted pulse width modulation signal OUT2 which is formed at a position where the off-switch trailing edge control signal ECNTLa constitutes the trailing edge of the inverted pulse width modulation signal OUT2.

The off-switch PWM pulse generator 90 and the inverter 91 generates the leading edge portion of the inverted pulse width modulation signal OUT2 on the basis of the off-switch leading edge control signal FCNTLa, and generates the trailing edge portion of the inverted pulse width modulation signal OUT2 on the basis of the trailing edge control signal ECNTLa. In other words, the PWM pulse generator 90 synthesizes the off-switch leading edge control signal FCNTLa and the off-switch trailing edge control signal ECNTLa, and thereby shapes the waveform of the inverted pulse width modulation signal OUT2 which constitutes the output signal.

In this respect, descriptions will be provided for a value of the off-switch leading edge position set value PWU2 and a value of the off-switch trailing edge position set value PWD2 which are used for the second exemplary embodiment. Because the off-switch leading edge control signal FCNTLa is asserted in the position located before the position where the leading edge control signal ECNTL is asserted, a value which is smaller than a value set up for the leading edge position set value PWU is set up for the off-switch leading edge control signal FCNTLa. Note that, when the leading edge position set value PWU is 0 (zero), the value of the off-switch leading edge position set value PWU2 is smaller than the number of clock cycles of the reference clock signal REFC which are included in the pulse width modulation signal OUT1. For instance, when the number of clock cycles of the reference clock signal REFC which are included in the pulse width modulation signal OUT1 is 30, the off-switch leading edge position set value PWU2 is equal to or smaller than 29.

Furthermore, because the off-switch trailing edge control signal ECNTLa is asserted in the position located after the position where the trailing edge control signal ECNTL is asserted, a value which is larger than a value set up for the trailing edge position set value PWD is set up for the off-switch trailing edge position set value PWD2. For instance, when the trailing edge position set value PWD is 3, a value which is equal to or larger than 4 is set up for the off-switch trailing edge position set value PWU2.

Figure 6:
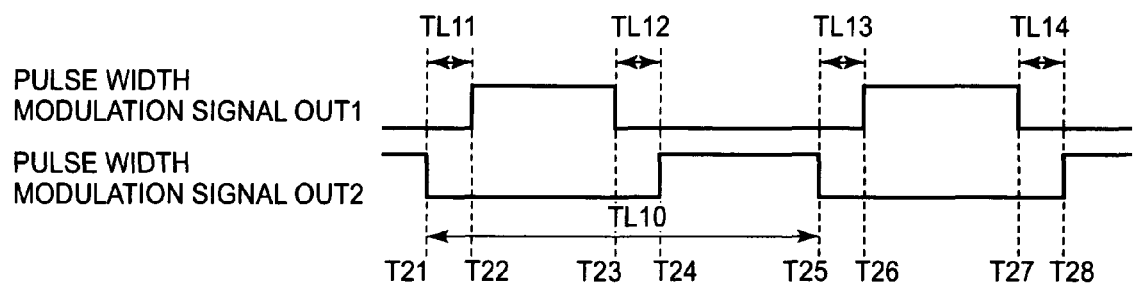
FIG. 6 is a diagram showing waveforms of the respective output signals outputted from the PWM controller according to the second exemplary embodiment 2.

FIG. 6 shows a relationship between the pulse width modulation signal OUT1 and the inverted pulse width modulation signal OUT2 which are outputted by the PWM controller 1a on the basis of these set values. In the PWM controller 1a, as shown in FIG. 6, the leading edge portion of the pulse width modulation signal OUT1 is located at timing T22, and the leading edge portion of the inverted pulse width modulation signal OUT2 is located at timing T21 earlier than timing T22. At this time, a time difference TL11 takes place between timing T21 and timing T22. During this time period TL11, the pulse width modulation signal OUT1 and the inverted pulse width modulation signal OUT2 are both turned off. As a result, the two transistors to be controlled are both in the OFF state.

In addition, during a time period from timing T22 through timing T23, due to the pulse width modulation signal OUT1, an ON transistor is in the ON state whereas an OFF transistor is in the OFF state. Subsequently, the pulse width modulation signal OUT1 falls at timing T23, and the inverted pulse width modulation signal OUT2 rises at timing T24. At this time, a time difference TL12 takes place between timing T23 and timing T24. During this time period TL12, the pulse width modulation signal OUT1 and the inverted pulse width modulation signal OUT2 are both turned off. As a result, the two transistors to be controlled are both in the OFF state. Subsequently, during a time period from timing T24 through timing T25, due to the pulse width modulation signal OUT1, the ON transistor is in the OFF state 1 whereas the OFF transistor is in the ON state. Subsequently, on and after timing T25, the operation performed from timing T21 through timing T25 is repeated.

As described above, the PWM controller 1a is capable of controlling the pulse width modulation signal OUT1 and the inverted pulse width modulation signal OUT2 independently of each other. If two complementarily-operating transistors are controlled with a single signal, then depending on the threshold values of the respective transistors, both the transistors are placed in the ON state at a falling edge or rising edge of the signal, so that a penetration current occurs. However, the pulse width modulation signal OUT1 and the inverted pulse width modulation signal OUT2 generated by the PWM controller 1a according to Exemplary embodiment 2 are capable of generating a time period during which two complementarily-operating transistors are both turned off before either of the two transistors is turned on. This makes it possible to prevent the two complementarily-operating transistors from causing a penetration current.

Note that the clock control circuit 61 asserts the clock stop signal RST3 on the basis of the off-switch trailing edge control signal ECNTLa. This is an alteration accompanying the change in configuration of the pulse width modulation signals. No substantial modification is introduced to the operation of the clock control circuit 61 or the function of the clock stop signal RST3.

It should be noted that the present invention is not limited to the above-described exemplary embodiments, and that the present invention can be modified whenever deemed necessary within a scope not departing from the gist of the present invention. For instance, the resolution controlling step may be modified by controlling the delay time of the resolution setting delay circuit 33b in the foregoing exemplary embodiments.

Further, it is noted that Applicant's intent is to encompass equivalents of all claim elements, even if amended later during prosecution.

What is claimed is:

1. A pulse width modulation (PWM) controller, comprising:
 a first counter which counts a reference clock signal, and outputs a first count value;
 a first counter controller which detects that the first count value reaches a first set value, and resets the first counter;
 a leading edge control signal generator which detects that the first count value reaches a second set value, and outputs a leading edge control signal specifying a leading edge position of a pulse width modulation signal;
 an adjustment clock generator which generates an adjustment clock signal having a cycle different from that of the reference clock signal;
 a second counter controller which detects that the first count value reaches a third set value, and instructs the adjustment clock generator to start an output operation thereof;
 a second counter which counts the adjustment clock signal, and outputs a second count value;
 a trailing edge control signal generator which detects that the second count value reaches a fourth set value, and generates a trailing edge control signal specifying a trailing edge position of the pulse width modulation signal; and
 a PWM pulse generator which generates a rising edge of the pulse width modulation signal on a basis of the leading edge control signal, and which generates a falling edge of the pulse width modulation signal on a basis of the trailing edge control signal.

2. The PWM controller according to claim 1, wherein a time length of one cycle of the adjustment clock signal is different from a time length of one cycle of the reference clock signal by a time length corresponding to a control step of the pulse width modulation signal in the PWM controller.

3. The PWM controller according to claim 1, wherein
 the first set value comprises a value for setting up a number of clock cycles of the reference clock signal which are included in one cycle of the pulse width modulation signal,
 the second set value comprises a value for setting up a number of clock cycles of the reference clock signal which are included in a time period from a starting position of one cycle of the pulse width modulation signal to a leading edge position of the pulse width modulation signal,
 the third set value comprises a value for setting up a value of the first count value which causes the adjustment clock signal to start to be outputted, and the fourth set value is set up on a basis of a number of clock cycles of the adjustment clock signal included in a time period from a position where the adjustment clock starts to be outputted to the trailing edge position of the pulse width modulation signal.

4. The PWM controller according to claim 1, wherein
each of the first to fourth set values is set up on a basis of a number of resolution cycles, one resolution cycle corresponding to a time difference between a time length of one cycle of the reference clock signal and a time length of one cycle of the adjustment clock signal,
the first set value is set up on a basis of a result of subtraction between a number of resolution cycles included in one cycle of the pulse width modulation signal and a number of resolution cycles included in one cycle of the reference clock signal,
the second set value is set up by a count value which is outputted from the first counter for a first time after the first counter is reset,
the third set value is set up on a basis of a number of clock cycles of the reference clock signal which are obtained from a difference between a number of resolution cycles included in an ON period of the pulse width modulation signal, and a number of resolution cycles of the adjustment clock signal obtained from a result of remainder arithmetic performed on the number of resolution cycles included in the ON period of the pulse width modulation signal and the number of resolution cycles included in one cycle of the reference clock signal, and
the fourth set value is set up on a basis of the remainder arithmetic performed on the number of resolution cycles included in the ON period thereof and the number of resolution cycles included in the reference clock signal.

5. The PWM controller according to claim 3, further comprising an arithmetic unit for performing an arithmetic operation on the first to fourth set values.

6. The PWM controller according to claim 1, wherein
the first counter controller comprises: a first register which stores the first set value; and a first comparator which outputs a result of comparison/coincidence between the first set value and the first count value as a reset signal for the first counter,
the leading edge control signal generator comprises: a second register which stores the second set value; and a second comparator which outputs a result of comparison/coincidence between the second set value and the first count value as the leading edge control signal,
the second counter controller comprises: a third register which stores the third set value; and a third comparator which outputs a result of comparison/coincidence between the third set value and the first count value as a reset signal for the adjustment clock generator, and
the trailing edge control signal generator comprises: a fourth register which stores the fourth set value; and a fourth comparator which outputs a result of comparison/coincidence between the fourth set value and the second count value as the trailing edge control signal.

7. The PWM controller according to claim 1, further comprising:
a second off-switch leading edge control signal generator which outputs an off-switch leading edge control signal, on a basis of the first count value and a fifth set value, at a position before an output position where the leading edge control signal generator outputs the leading edge control signal;
an off-switch trailing edge control signal generator which outputs an off-switch trailing edge control signal, on a basis of the second count value and a sixth set value, at a position after an output position where the trailing edge control signal generator outputs the trailing edge control signal; and
an off-switch PWM pulse generator which synthesizes an off-switch leading edge control signal and an off-switch trailing edge control signal, and generates an off-switch pulse width modulation signal.

8. The PWM controller according to claim 1, further comprising a clock control circuit which outputs a clock stop signal instructing the adjustment clock generator to stop the adjustment clock signal in response to the output of the trailing edge control signal.

9. A pulse waveform control method for a PWM controller for controlling a cycle and a pulse width of a pulse width modulation signal on a basis of a reference clock signal and an adjustment clock signal having a cycle which is different from that of the reference clock signal,
the method comprising:
detecting that a first count value obtained by counting the reference clock signal reaches a first set value, to reset the first count value;
counting the reference clock signal received after the reset, to generate the first count value;
detecting that the first count value reaches a second set value, to generate a leading edge control signal specifying a leading edge position of the pulse width modulation signal;
detecting that the first count value reaches a third set value, to start to output the adjustment clock signal;
counting the adjustment clock signal, to generate a second count value;
detecting that the second count value reaches a fourth set value, to generate a trailing edge control signal specifying a trailing edge position of the pulse width modulation signal; and
synthesizing the leading edge control signal and the trailing edge control signal, to generate the pulse width modulation signal.

10. A pulse waveform control method for a PWM controller for controlling a cycle and a pulse width of a pulse width modulation signal on a basis of a reference clock signal and an adjustment clock signal having a cycle which is different from that of the reference clock signal,
the method comprising:
setting up a length of one cycle of the pulse width modulation signal on a basis of a number of clock cycles of the reference clock signal;
setting up a leading edge position of the pulse width modulation signal on a basis of a number of clock cycles of the reference clock signal which are included in a time period from a starting position of one cycle of the pulse width modulation signal to the leading edge position of the pulse width modulation signal;
setting up a position where the adjustment clock signal starts to be outputted on a basis of a first count value; and
setting up a trailing edge position of the pulse width modulation signal on a basis of a number of clock cycles of the adjustment clock signal which are included in a time period from a position where the adjustment clock starts to be outputted to the trailing edge position of the pulse width modulation signal.

* * * * *